US012813012B2

(12) United States Patent
Jin et al.

(10) Patent No.: US 12,813,012 B2
(45) Date of Patent: Nov. 24, 2026

(54) SOLAR CELL, TANDEM SOLAR CELL AND PHOTOVOLTAIC MODULE

(71) Applicants: JINKO SOLAR (HAINING) CO., LTD., Haining (CN); ZHEJIANG JINKO SOLAR CO., LTD., Haining (CN)

(72) Inventors: Jingsheng Jin, Haining (CN); Nannan Yang, Haining (CN); Wei Cui, Haining (CN)

(73) Assignees: Jinko Solar (Haining) Co., Ltd., Haining (CN); Zhejiang Jinko Solar Co., Ltd., Haining (CN)

( * ) Notice: Subject to any disclaimer, the term of this patent is extended or adjusted under 35 U.S.C. 154(b) by 0 days.

(21) Appl. No.: 19/086,550

(22) Filed: Mar. 21, 2025

(65) Prior Publication Data

US 2025/0311480 A1 Oct. 2, 2025

(30) Foreign Application Priority Data

Apr. 1, 2024 (CN) ........................ 202410390210.X

(51) Int. Cl.
*H10F 77/50* (2025.01)
*H10F 10/142* (2025.01)

(52) U.S. Cl.
CPC ........... *H10F 77/50* (2025.01); *H10F 10/142* (2025.01)

(58) Field of Classification Search
CPC ...... H10F 77/50; H10F 10/142; H10F 10/166; H10F 71/129; H10F 71/133;
(Continued)

(56) References Cited

U.S. PATENT DOCUMENTS

2011/0000530 A1* 1/2011 Mihailetchi ........... H10F 77/215
257/E31.124
2011/0232741 A1* 9/2011 Fang ....................... H10F 10/14
136/256

(Continued)

FOREIGN PATENT DOCUMENTS

CN 111430506 A 7/2020

OTHER PUBLICATIONS

European Search Report issued in corresponding EP Application 25158904.0, issued Jun. 6, 2025 (6 pages).

(Continued)

*Primary Examiner* — Michael Y Sun
(74) *Attorney, Agent, or Firm* — Knobbe, Martens, Olson & Bear, LLP

(57) ABSTRACT

A solar cell includes a segmented solar cell, a composite layer, a first passivation layer, and a field passivation layer. The segmented solar cell includes a substrate and an emitter formed at one side of the substrate along a thickness direction of the solar cell, and the segmented solar cell includes at least one cutting surface parallel to the thickness direction. The composite layer is formed at one side of the segmented solar cell close to the cutting surface, and the composite layer is doped with aluminum element and oxygen element. The first passivation layer is provided at the cutting surface. The field passivation layer is provided at one side of the first passivation layer facing away from the first passivation layer. The field passivation layer and the emitter have doping elements of different electric-conductive types.

20 Claims, 4 Drawing Sheets

(58) Field of Classification Search
CPC .... H10F 71/136; H10F 77/211; H10F 77/311; H10F 19/00; H10F 19/40; H10F 19/80
See application file for complete search history.

(56) References Cited

U.S. PATENT DOCUMENTS

2012/0247529 A1* 10/2012 Zhang .................. H10F 19/908 257/E31.124
2013/0008501 A1* 1/2013 Guillevin ............. H10F 10/146 257/E31.127

OTHER PUBLICATIONS

Martel et al., "Addressing separation and edge passivation challenges for high efficiency shingle heterojunction solar cells", Solar Energy Materials & Solar Cells 250 (2023) 112095.
Kim et al., "Characterization of SiO2Al2O3 stack passivation with n-and p-type poly-Si layers", IEEE, 2021, pp. 1712-1715.

* cited by examiner

SOLAR CELL, TANDEM SOLAR CELL AND PHOTOVOLTAIC MODULE

TECHNICAL FIELD

The present disclosure relates to the technical field of photovoltaic cells, and in particular, to a solar cell, a tandem solar cell and a photovoltaic module.

BACKGROUND

Nowadays, various module technologies have emerged to improve the energy density of a photovoltaic module. Among them, module half-cut technology, shingled array module (SAM) technology are representative technologies. These technologies are characterized by cutting a whole solar cell wafer into one-half, one-third, or even smaller size of cut cell pieces, to fill as many cut cell pieces as possible in a module, increasing effective power generation area, and at the same time, due to the reduction in terms of the current in the cut cell pieces, causing a decrease in the loss of power and comprehensively improving the power of the module. In industrial applications, the way of dividing a solar cell wafer generally includes laser scribe and mechanical cleave, thermal laser low-damage cleave, etc., however it is prone to cause damage to the cut cell pieces in the process of dividing the solar cell wafer, thereby affecting the efficiency of the cut cell pieces.

SUMMARY

In view of this, the present disclosure provides a solar cell, a tandem solar cell and a photovoltaic module, helping to solve the problem in the related art that it is prone to cause damage to the cut cell pieces in the process of dividing the solar cell wafer, which would affect the efficiency of the cut cell pieces.

A first aspect of the present disclosure provides a solar cell, including a segmented solar cell, a composite layer, a first passivation layer, and a field passivation layer. The segmented solar cell includes a substrate and an emitter formed at one side of the substrate along a thickness direction of the solar cell, and the segmented solar cell includes at least one cutting surface parallel to the thickness direction. The composite layer is formed at one side of the segmented solar cell close to the cutting surface, and the composite layer is doped with aluminum element and oxygen element. The first passivation layer is provided at the cutting surface. The field passivation layer is provided at one side of the first passivation layer facing away from the composite layer. The field passivation layer and the emitter have doping elements of different electric-conductive types.

In a possible implementation manner, a doping concentration of the field passivation layer is greater than a doping concentration of the substrate.

In a possible implementation manner, the field passivation layer is one or more of a doped polycrystalline silicon layer, a doped amorphous silicon layer or a doped microcrystalline silicon layer.

In a possible implementation manner, along a first direction of the solar cell, a thickness d1 of the field passivation layer satisfies: 10 nm≤d1≤100 nm.

In a possible implementation manner, the first passivation layer is one or more of an aluminum oxide layer, a silicon oxide layer, a silicon nitride layer or a silicon nitride oxide layer.

In a possible implementation manner, along a first direction of the solar cell, a thickness d2 of the first passivation layer satisfies: 1 nm≤d2≤4 nm.

In a possible implementation manner, the composite layer includes a first region and a second region, the first region is a region of the composite layer which is formed at one side of the substrate and the emitter close to the cutting surface, and the first region is doped with aluminum element and oxygen element.

In a possible implementation manner, along a first direction of the solar cell, a thickness d3 of the composite layer satisfies: 20 nm≤d3≤500 nm.

In a possible implementation manner, a concentration of the aluminum element in the composite layer decreases along a direction away from the cutting surface.

In a possible implementation manner, a concentration of the oxygen element in the composite layer decreases along a direction away from the cutting surface.

In a possible implementation manner, the segmented solar cell further includes a second passivation layer, a tunnel oxide layer, a doped conductive layer, a third passivation layer, a first electrode and a second electrode along the thickness direction of the solar cell. The second passivation layer is provided at one side of the emitter away from the substrate, the tunnel oxide layer is provided at one side of the substrate away from the emitter, the doped conductive layer is provided at one side of the tunnel oxide layer away from the substrate, and the third passivation layer is provided at one side of the doped conductive layer away from the tunnel oxide layer. The first electrode passes through the second passivation layer to be electrically connected to the emitter, and the second electrode passes through the third passivation layer to be electrically connected to the doped conductive layer.

A second aspect of the present disclosure provides a tandem solar cell, including the bottom solar cell as described in any one of the above-mentioned embodiments, a top solar cell, and an intermediate connection layer. The top solar cell is one of a perovskite solar cell, a donor-acceptor solar cell, a cadmium telluride solar cell, a copper indium gallium selenide solar cell, or a gallium arsenide solar cell. The intermediate connection layer is connected between the bottom solar cell and the top solar cell.

A third aspect of the present disclosure provides a photovoltaic module, including a cell string, an encapsulation layer, and a cover plate. The cell string is formed by connecting a plurality of solar cells as described in any one of the above-mentioned embodiments. The encapsulation layer is configured to cover a surface of the cell string. The cover plate is configured to cover a surface of the encapsulation layer away from the cell string.

In the present disclosure, providing the first passivation layer at the cutting surface can protect the cutting surface of the segmented solar cell from contaminants, and the first passivation layer can provide good passivation for the region of the segmented solar cell that has been exposed at the cutting surface, reduce the interface state density at the cutting surface, reduce the recombination of minority carriers, and improve the service life of minority carriers, thereby reducing the recombination rate at the cutting surface. The composite layer formed by doping aluminum element and oxygen element at an inner side of the cutting surface of the segmented solar cell has a broader bandgap width, thereby enabling a good field passivation effect to be formed between the composite layer and the substrate, further improving the passivation effect of the first passivation layer on the cutting surface, and achieving better passivation for the region of the segmented solar cell which has been exposed at the cutting surface. Meanwhile, the field passivation layer having a doping element of a different electric-conductive type than the emitter is provided at one side of the first passivation layer facing away from the composite layer, thereby further reducing the concentration of minority carriers in the emitter at the cutting surface, further reducing the interface state density, and thus further improving the passivation effect at the cutting surface and reducing the recombination efficiency at the cutting surface.

Therefore, for the solar cell of this structure, with the mutual cooperation of the composite layer, the first passivation layer, and the field passivation layer, it is possible to achieve better passivation for the region of the substrate and the emitter of the segmented solar cell which has been exposed at the cutting surface simultaneously, to improve the effect of repairing the cutting damage to the solar cell, and thus improving the efficiency of the solar cell and to improve module power.

It should be understood that the above general description and the following detailed description are merely exemplary and cannot limit the present disclosure.

BRIEF DESCRIPTION OF DRAWINGS

To better illustrate the technical solutions of the embodiments of the present disclosure, the accompanying drawings required to be used in the embodiments will be introduced briefly in the following. Apparently, the accompanying drawings in the following description are only some embodiments of the present disclosure, and those skilled in the art can also obtain other drawings according to these drawings without creative efforts.

REFERENCE NUMERALS

Figure 1:
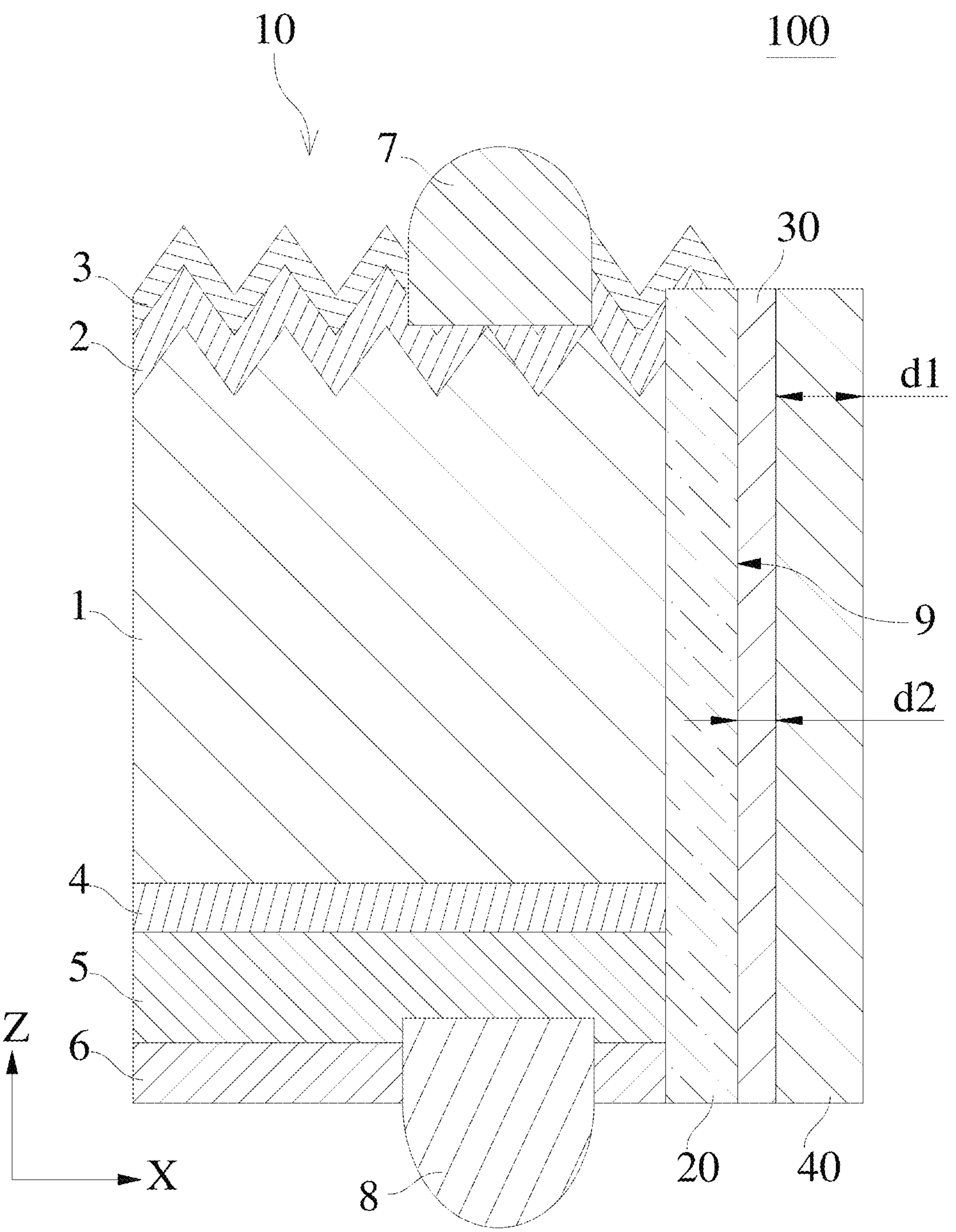
FIG. 1 is a cross-sectional structural schematic diagram of a solar cell according to some embodiments of the present disclosure.

- 100—solar cell;
- 10—segmented solar cell;
  - 1—substrate;
  - 2—emitter;
  - 3—second passivation layer;
  - 4—tunnel oxide layer;
  - 5—doped conductive layer;
  - 6—third passivation layer;
  - 7—first electrode;
  - 8—second electrode;
  - 9—cutting surface;
- 20—composite layer;
  - 201—first region;
  - 202—second region;
- 30—first passivation layer;
- 40—field passivation layer;
- 110—cell string;
- 120—encapsulation layer;
- 130—cover plate;
- 140—top solar cell;
- 150—intermediate connection layer;
- X—first direction;
- Z—thickness direction.

The accompanying drawings here, which are incorporated in and constitute a part of the description, show the embodiments consistent with the present disclosure and, together with the description, serve to explain the principles of the present disclosure.

DESCRIPTION OF EMBODIMENTS

To better illustrate the technical solutions of the present disclosure, the embodiments of the present disclosure are described in detail below in conjunction with the accompanying drawings.

In the description of the present disclosure, the terms "first" and "second" are used for descriptive purposes only and cannot be construed as indicating or implying relative importance; unless otherwise explicitly specified or indicated, the term "multiple/a plurality of" means two or more; and the terms "connection", "fixation" and the like are to be construed in a broad sense, for example, a "connection" may be a fixed connection, a detachable connection, or an integral connection, an electrical connection, a direct connection, or an indirect connection through an intermediary. For those of ordinary skill in the art, the specific meanings of the above terms in the present disclosure can be understood according to the specific circumstances.

The terms used in the embodiments the present disclosure are for the purpose of describing particular embodiments only and is not intended to limit the present disclosure. As used in the embodiments of the present disclosure and in the attached claims, the singular forms "a/an", "the", and "said" are intended to include plural form as well, unless the context clearly dictates otherwise.

It should be understood that the term "and/or" as used herein merely describes associations between associated objects, and it indicates three types of relationships, for example, A and/or B may indicate that A exists alone, A and B coexist, or B exists alone. In addition, the character "/" herein generally indicates that the associated objects are in an "or" relationship.

It should be noted that the directional words such as "above", "below", "upper", "lower", "left", "right" and the like described in the embodiments of the present disclosure are described at the perspective shown in the accompanying drawings, and should not be understood as limiting the embodiments of the present disclosure. Further, in this context, it should be understood that when referring to an element being connected "above" or "below" another element, the element can not only be directly connected "above" or "below" the another element, but the element can also be indirectly connected "above" or "below" the another element via an intermediate element.

Nowadays, various module technologies have emerged to improve the energy density of a photovoltaic module. Among them, module half-cut technology, shingled array module (SAM) technology are representative technologies. These technologies are characterized by cutting a whole solar cell wafer into one-half, one-third, or even smaller size of cut cell pieces, to form a half-cut solar cell or a segmented solar cell, so as to fill as many cut cell pieces as possible in a module, increasing effective power generation area, and at the same time, due to the reduction in terms of the current in the cut cell pieces, causing a decrease in the loss of power and comprehensively improving the power of the module. In industrial applications, the way of dividing a solar cell wafer generally includes laser scribe and mechanical cleave, thermal laser low-damage cleave, etc., however it is prone to cause damage to the cut cell pieces in the process of dividing the solar cell wafer, which would affect the efficiency of the cut cell pieces.

In view of this, some embodiments of the present disclosure provide a solar cell, a tandem solar cell, and a photovoltaic module, to reduce a recombination rate at a cutting surface and to improve the efficiency of a solar cell. The solar cell may be a tunnel oxide passivated contact (TOPCon) cell, for example, a double-side tunnel oxide passivated contact cell or a single-side tunnel oxide passivated contact cell.

As shown in FIG. 1, a solar cell 100 includes a segmented solar cell 10, a composite layer 20, a first passivation layer 30, and a field passivation layer 40. Along a thickness direction Z of the solar cell 100, the segmented solar cell 10 includes a substrate 1 and an emitter 2 formed at one side of the substrate 1. The segmented solar cell 10 is formed by cutting a whole solar cell wafer.

The segmented solar cell 10 includes at least one cutting surface 9 parallel to the thickness direction Z. The composite layer 20 is formed at one side of the segmented solar cell 10 close to the cutting surface 9, the composite layer 20 is doped with aluminum element and oxygen element, the first passivation layer 30 is provided at the cutting surface 9, and the field passivation layer 40 is provided at one side of the first passivation layer 30 facing away from the composite layer 20. The field passivation layer 40 and the emitter 2 have doping elements of different electric-conductive types.

Figure 2:
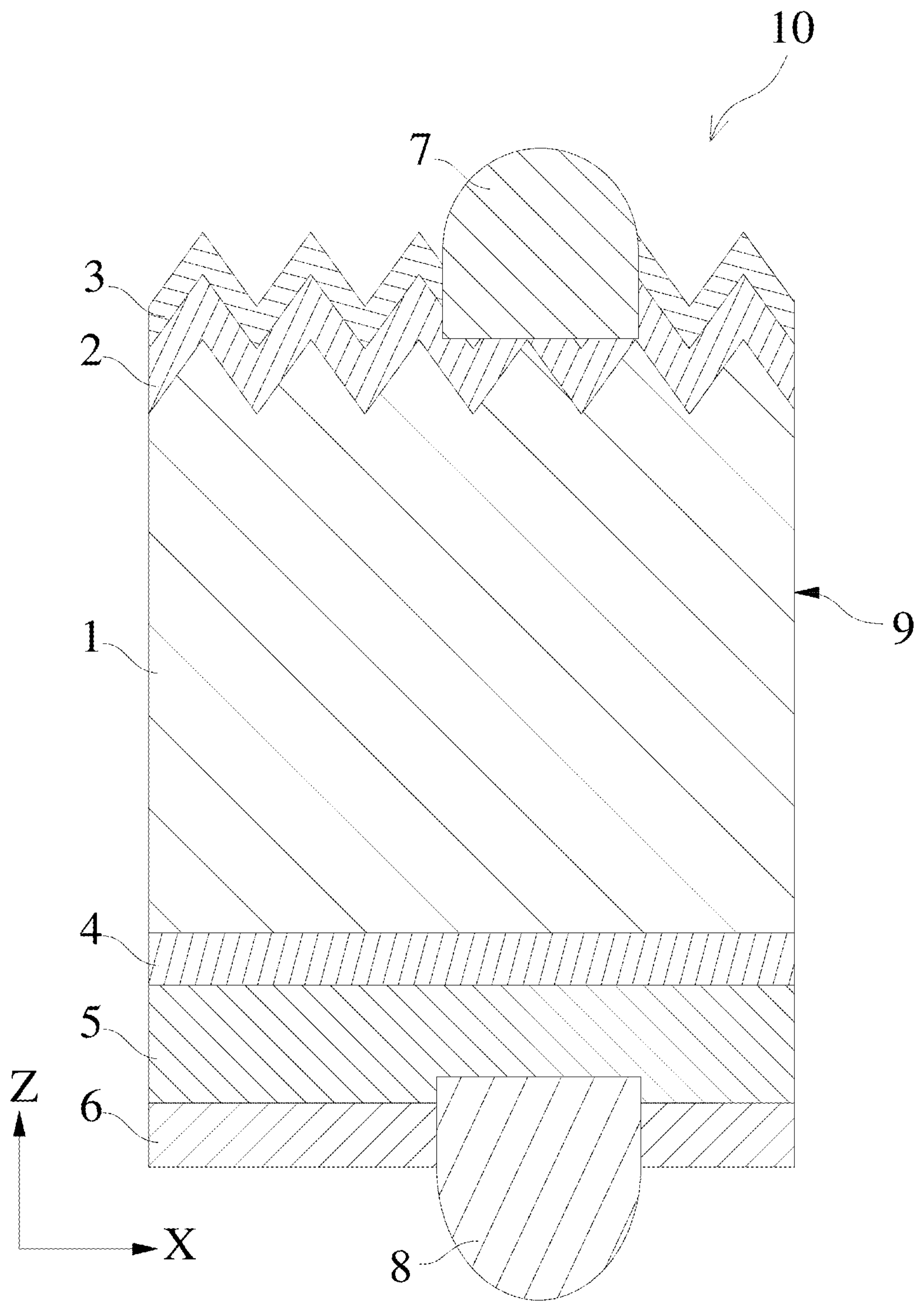
FIG. 2 is a cross-sectional structural schematic diagram of a body of a solar cell according to some embodiments of the present disclosure.

As shown in FIG. 2, the substrate 1 of the segmented solar cell 10 is used for receiving incident light and generating photogenerated carriers. In some embodiments, the substrate 1 is a silicon substrate and may include one or more of monocrystalline silicon, polycrystalline silicon, amorphous silicon, or microcrystalline silicon. In other embodiments, the material of the substrate 1 may be silicon carbide, an organic material, or a multicomponent compound. The multicomponent compound may include, but is not limited to, materials such as perovskite, gallium arsenide, cadmium telluride, copper indium selenide, and the like. Exemplarily, the substrate 1 in some embodiments of the present disclosure is a monocrystalline silicon substrate. The substrate 1 includes a doping element, the type of the doping element may be N-type or P-type. The N-type element can be a Group V element, such as phosphorus (P) element, bismuth (Bi) element, antimony (Sb) element, or arsenic (As) element, and the like, and P-type element may be a III element such as boron (B) element, aluminum (Al) element, gallium (Ga) element or indium (In) element, and the like. In an example, the substrate 1 is a P-type silicon substrate, and the type of the doping element in the substrate 1 is P-type. In another example, the substrate 1 is an N-type silicon substrate, and the type of the doping element in the substrate 1 is N-type. Exemplarily, in some embodiments of the present disclosure, for example, the substrate 1 is an N-type silicon substrate, thereby improving the conversion efficiency of the solar cell 100 and reducing manufacturing cost. The emitter 2 and the substrate 1 include different types of doping elements, and the emitter 2 and the substrate 1 can form a PN junction structure together. Exemplarily, the substrate 1 is an N-type silicon substrate, and a P-type emitter 2 may be formed by performing boron diffusion on the substrate 1.

As shown in FIG. 2, the cutting surface 9 of the segmented solar cell 10 formed by cutting is parallel to the thickness direction Z. The cutting results in at least a portion of the emitter 2 and at least a portion of the substrate 1 of the segmented solar cell 10 being exposed at the cutting surface 9, thereby easily causing recombination of the region of the substrate 1 and the region of the PN junction.

In some embodiments, as shown in FIG. 1, providing the first passivation layer 30 at the cutting surface 9 can protect the cutting surface 9 of the segmented solar cell 10 from contaminants, and the first passivation layer 30 can provide good passivation for the region of the segmented solar cell 10 that has been exposed at the cutting surface 9, thereby reducing the interface state density at the cutting surface 9, reducing the recombination of minority carriers, increasing the service life of the minority carriers, and reducing the recombination rate at the cutting surface 9. The composite layer 20 formed by doping aluminum element and oxygen element at an inner side of the cutting surface 9 of the segmented solar cell 10 has a broader bandgap width, thereby enabling a good field passivation effect to be formed between the composite layer 20 and the substrate 1, further improving the passivation effect of the first passivation layer 30 on the cutting surface 9, and achieving better passivation for the region of the segmented solar cell 10 which has been exposed at the cutting surface 9. Meanwhile, the field passivation layer 40 having a doping element of a different electric-conductive type than the emitter 2 is provided at one side of the first passivation layer 30 facing away from the composite layer 20, thereby further reducing the concentration of minority carriers in the emitter 2 at the cutting surface 9, further reducing the interface state density, further improving the passivation effect at the cutting surface 9, and reducing the recombination efficiency at the cutting surface 9.

Therefore, in the solar cell 100 of this structure, with the mutual cooperation of the composite layer 20, the first passivation layer 30, and the field passivation layer 40, it is possible to achieve better passivation for the region of the substrate 1 and the emitter 2 of the segmented solar cell 10 which has been exposed at the cutting surface 9 simultaneously, to improve the effect of repairing the cutting damage to the solar cell 100, thereby improving the efficiency of the solar cell 100 and improving the module power.

The number of the cutting surfaces 9 of the segmented solar cell 10 may be 1, 2, 3, 4, etc., depending on the difference in the region of the segmented solar cell 10 at the uncut whole solar cell wafer, without limitation herein.

It should be noted that the above-described composite layer 20, first passivation layer 30, and field passivation layer 40 are all provided at the side of the segmented solar cell 10 where the cutting surface 9 is formed. That is, the segmented solar cell 10 includes a plurality of cutting surfaces 9; and the composite layer 20, the first passivation layer 30, and the field passivation layer 40 are provided at each side of the segmented solar cell 10 where the cutting surface 9 is formed, to realize passivation for the exposed region at the cutting surfaces 9, thereby improving the repair effect for the cutting damage to the solar cell 100, and improving the efficiency of the solar cell 100 and improving the module power.

In some embodiments, as shown in FIG. 1, a doping concentration of the field passivation layer 40 is greater than a doping concentration of the substrate 1.

In some embodiments, the doping concentration of the field passivation layer 40 is greater than the doping concentration of the substrate 1, thereby forming a doping concentration difference between the field passivation layer 40 and the substrate 1, to form a high-low junction between the field passivation layer 40 and the substrate 1, thus improving the field passivation effect, and further improving the passivation effect of the field passivation layer 40 on the cutting surface 9.

In some embodiments, as shown in FIG. 1, the field passivation layer 40 is a single-layer structure of one of a doped polysilicon layer, a doped amorphous silicon layer, or a doped microcrystalline silicon layer.

In some embodiments, as shown in FIG. 1, polysilicon, amorphous silicon, and microcrystalline silicon have the advantages of a stable structure, easily forming, and low cost, and are easy for doping of a doping element. Therefore, when the field passivation layer 40 is one of a doped polysilicon layer, a doped amorphous silicon layer, or a doped microcrystalline silicon layer, it can facilitate the formation of the field passivation layer 40, reduce the cost thereof, and improve the design freedom of the solar cell 100 and meet the design requirements of the solar cell 100.

Of course, the field passivation layer 40 may also be a stacked-layer structure including more than one of a doped polysilicon layer, a doped amorphous silicon layer, or a doped microcrystalline silicon layer, no limitation is made herein.

In addition, when the field passivation layer 40 is one or more of a doped polysilicon layer, a doped amorphous silicon layer, or a doped microcrystalline silicon layer, the formation efficiency of the field passivation layer 40 is higher than the formation efficiency of the first passivation layer 30. Therefore, the first passivation layer 30 can be designed to be lighter and thinner while ensuring the passivation effect thereof, but the field passivation layer is designed to be thicker, so as to be able to ensure that the field passivation layer 40 and the first passivation layer 30 can coordinate with each other to improve the passivation effect at the cutting surface 9 and improve the formation efficiency.

In some embodiments, as shown in FIG. 1, a thickness d1 of the field passivation layer 40 along a first direction X of the solar cell 100 satisfies: 10 nm≤d1≤100 nm. For example, the thickness d1 of the field passivation layer 40 may be 10 nm, 20 nm, 30 nm, 40 nm, 50 nm, 60 nm, 70 nm, 80 nm, 90 nm, 100 nm, and the like. Of course, the thickness d1 of the field passivation layer 40 may also be other value within the above-mentioned range, no limitation is made herein.

In some embodiments, as shown in FIG. 1, if the thickness d1 of the field passivation layer 40 is too small, for example, d1<10 nm, the field passivation layer 40 is not able to have a field passivation effect and is prone to be worn out; and if the thickness d1 of the field passivation layer 40 is too large, for example, d1>100 nm, the thickness of the first passivation layer 30 is too thick, which is prone to increase an overall volume of the solar cell 100, and also to increase formation material and production cost thereof.

Therefore, when the thickness d1 of the field passivation layer 40 satisfies 10 nm≤d1≤100 nm, the thickness of the field passivation layer 40 is moderate, the field passivation layer 40 has good wear-resistant properties, the field passivation layer 40 can better cooperate with the composite layer 20 and the first passivation layer 30 to improve the passivation effect at the cutting surface 9 and can avoid the volume of the solar cell 100 from being too large, and the production cost thereof is lower, which is convenient for mass production.

In some embodiments, as shown in FIG. 1, the first passivation layer 30 is an aluminum oxide layer.

In some embodiments, when the first passivation layer 30 is an aluminum oxide layer, the first passivation layer 30 is self-negatively charged. When the substrate 1 is an N-type silicon substrate and the emitter 2 is a P-type emitter, the minority carriers in the emitter 2 are negatively charged electrons. Therefore, the negative charges in the first passivation layer 30 can repel the minority carriers in the emitter 2, thereby being able to prevent the minority carriers in the emitter 2 from reaching the cutting surface 9 to form recombination, thus reducing the recombination rate at the cutting surface 9, improving the passivation effect at the cutting surface 9, and improving the efficiency of the solar cell. The aluminum oxide can also promote the repair of defects at the silicon surface, thereby improving the repairing effect on the region of the emitter 2 and the region of the substrate 1 which have been exposed at the cutting surface 9 due to the damage generated by the cutting, and improving the efficiency of the solar cell 100. The aluminum oxide can also serve to protect the segmented solar cell 10 from corrosion, while improving the stability and abrasion resistance of the cutting surface 9, and extending the service life of the solar cell 100.

In addition, when the first passivation layer 30 is an aluminum oxide layer, an atomic layer deposition (ALD) technique may be used to deposit the aluminum element on the cutting surface 9 to form the first passivation layer 30, and under a continuous heating and source supplying condition, the aluminum element and the oxygen element are advanced towards the inside of the segmented solar cell 10, doping the aluminum element and oxygen element in the first passivation layer 30 into the segmented solar cell 10 to form the composite layer 20, and the depth and concentration of the aluminum element and oxygen element doped in the segmented solar cell 10 can be adjusted by controlling the reaction temperature and time, thereby reducing the difficulty of performing aluminum element and oxygen element doping on the segmented solar cell 10, thus making the formation of the composite layer 20 easier, and improving the production efficiency and saving cost.

Of course, it is also possible to form the first passivation layer 30 at the cutting surface 9 after first doping the aluminum element and the oxygen element into the segmented solar cell 10 to form the composite layer 20, which can be specifically configured according to the actual needs and no limitation is made herein.

In some other embodiments, the first passivation layer 30 may be a single-layer structure of any one of a silicon nitride layer, a silicon nitride oxide layer, a silicon oxide layer; or the first passivation layer 30 may be a stacked-layer structure formed by a combination of more of an aluminum oxide layer, a silicon nitride layer, a silicon nitride oxide layer, a silicon oxide layer, a silicon oxide layer, for example, the first passivation layer 30 is a stacked-layer structure formed by an aluminum oxide layer and a silicon nitride layer, and so forth. Of course, the first passivation layer 30 may also adopt other type of passivation layer, no limitation is made herein.

In some embodiments, as shown in FIG. 1, along a first direction X of the solar cell 100, a thickness d2 of the first passivation layer 30 satisfies: 1 nm≤d2≤4 nm, where the first direction X is substantially perpendicular to the thickness direction Z. For example, the thickness d2 of the first passivation layer 30 may be 1 nm, 2 nm, 3 nm, 4 nm, etc., and of course, the thickness d2 of the first passivation layer 30 may be other value within the above-mentioned range, no limitation is made herein.

In some embodiments, as shown in FIG. 1, if the thickness d2 of the first passivation layer 30 is too small, for example, d2<1 nm, the passivation effect of the first passivation layer 30 is poor, and the formation of the first passivation layer 30 is more difficult; and if the thickness d2 of the first passivation layer 30 is too large, for example, d2>4 nm, the thickness of the first passivation layer 30 is too large, which is prone to increase an overall volume of the solar cell 100, and is not conducive to realizing the field passivation effect by the field passivation layer 40, and will increase formation time and reduce formation efficiency.

Therefore, when the thickness d2 of the first passivation layer 30 satisfies 1 nm≤d2≤4 nm, the first passivation layer 30 has a moderate thickness, which is easy to be formed, has a good passivation effect, and is able to better cooperate with the field passivation layer 40 to achieve better passivation at the cutting surface 9.

In some embodiments, as shown in FIG. 1, the segmented solar cell 10 further includes a second passivation layer 3, a tunnel oxide layer 4, a doped conductive layer 5, a third passivation layer 6, a first electrode 7, and a second electrode 8 along the thickness direction Z of the solar cell 100.

The second passivation layer 3 is provided at one side of the emitter 2 away from the substrate 1. The second passivation layer 3 can achieve good passivation at a surface of the one side of the emitter 2 away from the substrate 1, reduces the interface state density, reduces the recombination of minority carriers, improves the transport efficiency of the carriers at the interface, and improves the efficiency of the solar cell 100. The second passivation layer 3 may also have the function of reducing or eliminating reflected light at the surface of the solar cell and increasing the amount of light transmission, thereby further improving the photoelectric conversion efficiency of the solar cell. Exemplarily, the second passivation layer 3 may be deposited by using a plasma improved chemical vapor deposition method, and of course other methods may be used, for example, an organic chemical vapor deposition method, etc., to form the second passivation layer 3. The second passivation layer 3 may be a single-layer structure or a stacked-layer structure, and the refractive index and thickness of each layer may be designed correspondingly. For example, the second passivation layer 3 may be any one or a combination of more of a silicon nitride layer, a silicon nitride oxide layer, and a silicon oxide layer. Of course, the second passivation layer 3 may also be other type of passivation layer, no limitation is made herein.

The tunnel oxide layer 4 is provided at one side of the substrate 1 away from the emitter 2. The tunnel oxide layer 4 mainly serves as a tunnel layer for the majority carriers, and at the same time is capable of chemically passivating the surface of the substrate 1 to reduce the interface state density, so as to allow the majority carriers to tunnel into the doped conductive layer 5, and at the same time can block the recombination of minority carriers. Exemplarily, the tunnel oxide layer 4 may be an ultrathin silicon oxide layer, a thickness of which may generally be within a range from 1 nm to 2 nm, which may be specifically set according to the actual requirements and no limitation is made herein. In some embodiments, an ozone oxidation method, a high temperature thermal oxidation method, a nitric acid oxidation method, a chemical vapor deposition method, and a low-pressure chemical vapor deposition method may be used to form the tunnel oxide layer 4 at the one side of the substrate 1 facing away from the emitter 2.

The doped conductive layer 5 is provided at one side of the tunnel oxide layer 4 away from the substrate 1. The doped conductive layer 5 can be used as a field passivation layer, and the doped conductive layer 5 and the tunnel oxide layer 4 together form a passivation contact structure, which further improves the passivation effect at the surface of the substrate 1. The doping element in the doped conductive layer 5 is the same as the doping element in the substrate 1 and forms a concentration difference with the doping element in the substrate 1, so that the doped conductive layer 5 can form a good contact with a metal electrode and can form an energy band bending at the surface of the substrate 1, realizing selective transport of carriers and reducing the loss of recombination. The doped conductive layer 5 can be formed by depositing at the surface of the tunnel oxide layer 4 by using any one of a physical vapor deposition method, a chemical vapor deposition method, a plasma improved chemical vapor deposition method, and an atomic layer deposition method.

The third passivation layer 6 is provided at one side of the doped conductive layer 5 away from the tunnel oxide layer 4. The third passivation layer 6 can achieve good passivation at a surface of the one side of the doped conductive layer 5 facing away from the substrate 1, reduce the interface state density, reduce the recombination of minority carriers, improve the transport efficiency of the carriers at the interface, and improve the efficiency of the solar cell 100. Exemplarily, the third passivation layer 6 may be deposited by a plasma improved chemical vapor deposition method, and of course other methods, for example, an organic chemical vapor deposition method, may be used to form the third passivation layer 6. The third passivation layer 6 may be a single-layer structure or a stacked-layer structure, and the thickness of each layer may be designed correspondingly. For example, the third passivation layer 6 may be any one or a combination of more of a silicon nitride layer, a silicon nitride oxide layer, a silicon oxide layer, and an aluminum oxide layer. Of course, the third passivation layer 6 may also be other type of passivation layer, no limitation is made herein.

The first electrode 7 passes through the second passivation layer 3 to be electrically connected to the emitter 2, and the second electrode 8 passes through the third passivation layer 6 to be electrically connected to the doped conductive layer 5. Exemplarily, the first electrode 7 and the second electrode 8 may be formed in a screen printing and sintering manner. In some embodiments, the metal paste for forming the first electrode 7 and the second electrode 8 may be one or more of aluminum, silver, gold, nickel, molybdenum, or copper, no limitation is made herein.

It should be noted that during the formation process of the above-described first passivation layer 30 and field passivation layer 40, at least a part of the first passivation layer 30 and the field passivation layer 40 may be positioned on the second passivation layer 3 and/or the third passivation layer 6, to further improve the formation efficiency and reduce the formation difficulty, and the first passivation layer 30 and the field passivation layer 40 do not contact the first electrode 7 and the second electrode 8, thereby reducing the detrimental effect of the degree of winding, thus improving the efficiency and production yield of the solar cell 100.

Figure 3:
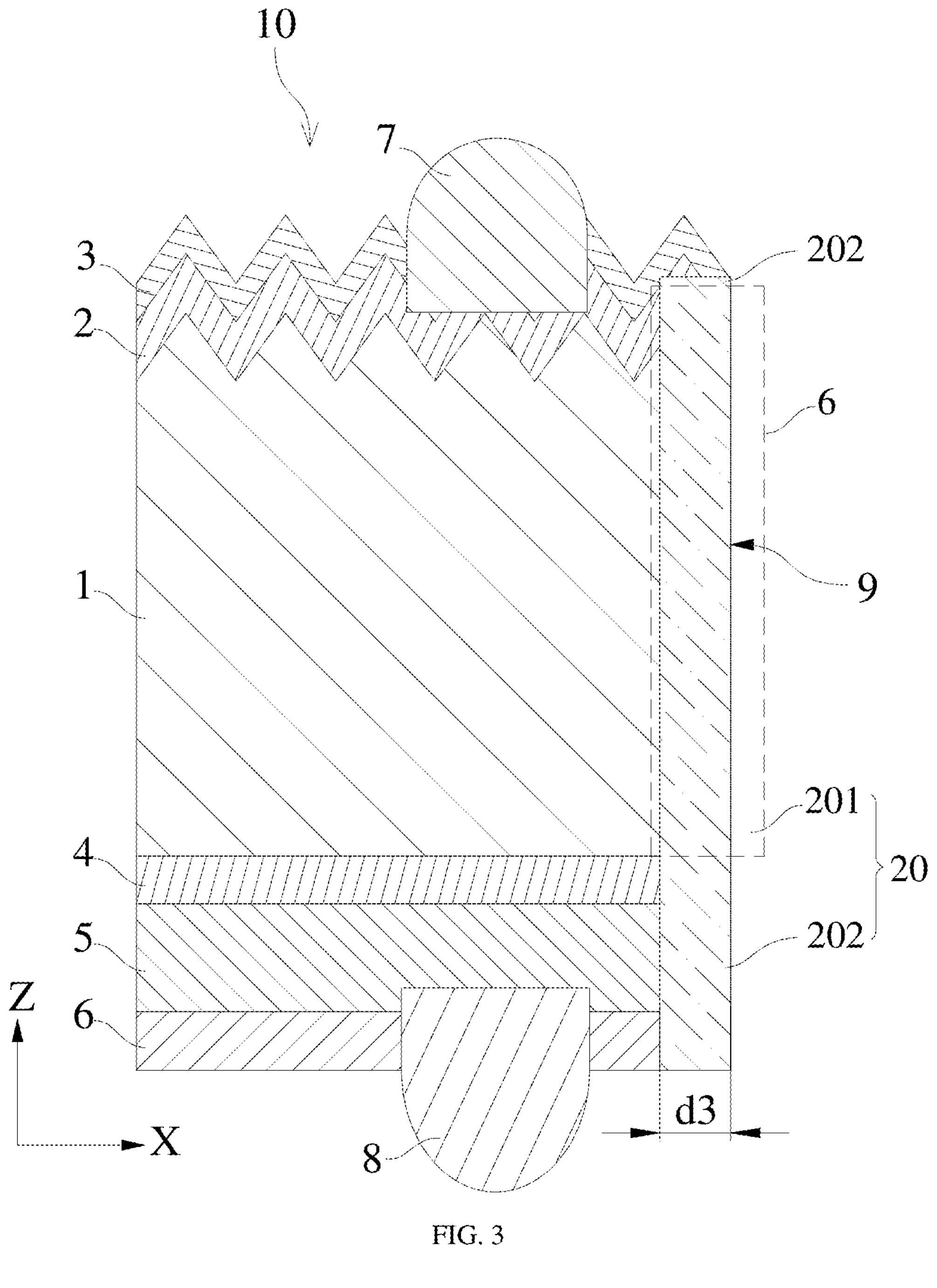
FIG. 3 is a cross-sectional structural schematic diagram of a partial structure of a solar cell according to some embodiments of the present disclosure.

In some embodiments, as shown in FIG. 3, the composite layer 20 is composed of a first region 201 and a second region 202.

As shown in FIG. 3, the first region 201 is a region of the composite layer 20 which is at one side of the substrate 1 and the emitter 2 close to the cutting surface 9, and the first region 201 is doped with the aluminum element and the oxygen element.

The recombination at the cutting surface 9 is mainly the recombination at the region of the substrate 1 and the region of the PN junction caused by at least a part of the region of the emitter 2 and the substrate 1 being exposed at the cutting surface 9. In some embodiments of the present disclosure, doping the first region 201 with aluminum element and oxygen element enables a targeted field passivation for the region of the substrate 1 and the emitter 2 which has been exposed at the cutting surface 9, thereby improving the passivation effect for the substrate 1 and the emitter 2 at the cutting surface 9, and improving the efficiency of the solar cell.

The second region 202 is the region of the composite layer 20 which is formed at one side of the second passivation layer 3, the tunnel oxide layer 4, the doped conductive layer 5 and the third passivation layer 6 close to the cutting surface 9, and the second region 202 is also doped with aluminum element and oxygen element, thereby being able to further reduce the difficulty of doping the oxygen element and the aluminum element, reduce production processes, improve production efficiency, and facilitate the mass production of the solar cell 100.

It should be noted that in the above-mentioned composite layer 20, for two parts of the second region 202 located at two sides of the first region 201, both the two parts of the second region 202 may be doped with aluminum element and oxygen element, or only one of the two parts of the second region 202 may be doped with aluminum element and oxygen element, or neither of the two parts of the second region 202 may be doped with oxygen element and aluminum element, as long as it is ensured that the first region 201 is doped with aluminum element and oxygen element, no limitation is made herein.

In some embodiments, as shown in FIG. 3, along a first direction X of the solar cell 100, a thickness d3 of the composite layer 20 satisfies: 20 nm≤d3≤500 nm. For example, the thickness d3 of the composite layer 20 may be 20 nm, 50 nm, 100 nm, 150 nm, 200 nm, 300 nm, 400 nm, 500 nm, and the like, and of course, the thickness d3 of the composite layer 20 may also be other value within the above-mentioned range, no limitation is made herein.

In some embodiments, if the thickness of the composite layer 20 is too small, for example, d3<20 nm, the doping concentration of the aluminum element and the oxygen element in the segmented solar cell 10 is too low, which results in a poor field passivation effect of the composite layer 20; and if the thickness d3 of the composite layer 20 is too large, for example, d3>500 nm, the doping of the aluminum element and the oxygen element is too difficult and the doping process time is longer, which would increase the production cost.

Therefore, when the thickness d3 of the composite layer 20 satisfies 20 nm≤d3≤ 500 nm, the composite layer 20 can play a good field passivation effect, and the doping depth of the aluminum element and the oxygen element is not too deep, thereby reducing the difficulty of doping and saving production cost.

In some embodiments, as shown in FIG. 3, a concentration of the aluminum element in the composite layer 20 gradually decreases along a direction away from the cutting surface 9.

If the doping concentration of the aluminum element in the non-metallic region of the substrate 1 and the emitter 2 of the segmented solar cell 10 is too high, the loss of the carriers in the transport process may occur, resulting in Auger recombination. Herein, the non-metal region is the region of the emitter 2 and the substrate 1 which does not correspond to the metal electrode.

In some embodiments, as shown in FIG. 3, the concentration of the aluminum element in the composite layer 20 gradually decreases along the direction away from the cutting surface 9, which is easy for formation and implementation, and can avoid the doping concentration of the aluminum element in the non-metallic region of the substrate 1 and the emitter 2 of the segmented solar cell 10 from being too high, thereby reducing the loss of the carriers during the transport process, reducing Auger recombination, avoiding the loss of the electric current and the open voltage, and improving the efficiency of the solar cell 100.

In some embodiments, as shown in FIG. 3, a concentration of the oxygen element in the composite layer 20 gradually decreases along a direction away from the cutting surface 9.

In some embodiments, as shown in FIG. 3, the doping of the oxygen element can broaden the bandgap width of the composite layer 20, thereby improving the composite layer 20 to be able to form a higher field passivation effect between the composite layer 20 and the substrate 1, and further improving the passivation effect. And, the concentration of the oxygen element in the composite layer 20 gradually decreases along the direction away from the cutting surface 9, which is easy for formation and implementation, and further saves the production cost.

Figure 4:
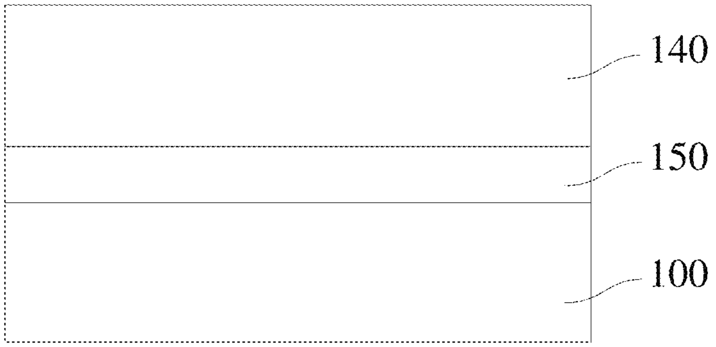
FIG. 4 is a structural schematic diagram of a tandem solar cell according to some embodiments of the present disclosure.

Some embodiments of the present disclosure further provide a tandem solar cell, as shown in FIG. 4, the tandem solar cell includes a bottom solar cell, a top solar cell 140, and an intermediate connection layer 150. The bottom solar cell is the solar cell 100 in any of the above-described embodiments. The top solar cell 140 is one of a perovskite solar cell, a donor-acceptor cell, a cadmium telluride (CdTe) solar cell, a copper indium gallium selenide (CIGS) solar cell, or a gallium arsenide (GaAs) solar cell. The intermediate connection layer 150 is connected between the bottom solar cell and the top solar cell 140. Since the solar cell 100 has the above-described technical effects, the photovoltaic module including the solar cell 100 should also have the above-described technical effects, which will not be repeated herein.

As shown in FIG. 4, the bandgap width of the top solar cell 140 is wider than the bandgap width of the bottom solar cell, thus, stacking the top solar cell 140 above the bottom solar cell can make the tandem solar cell have a wider spectral response range, thereby maximizing the use of solar energy and improving the efficiency of the solar cell.

The intermediate connection layer 150 is generally a tunnel junction or a very thin metal or transparent electrode composite layer. Exemplarily, the intermediate connection layer 150 may be transparent conductive oxides (TCOs), which have good optoelectronic properties, high photon permeability and high electrical conductivity, thereby enabling the top solar cell 140 and the bottom solar cell to maintain good ohmic contact.

Figure 5:
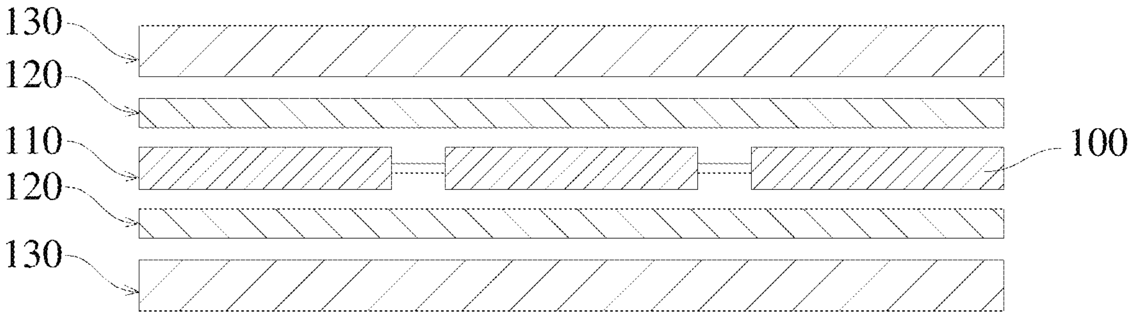
FIG. 5 is a structural schematic diagram of a photovoltaic module according to some embodiments of the present disclosure.

Some embodiments of the present disclosure further provide a photovoltaic module, as shown in FIG. 5, the photovoltaic module includes a cell string 110, an encapsulation layer 120, and a cover plate 130. The cell string 110 is formed by connecting a plurality of solar cells 100 in any one of the above-described embodiments. The encapsulation layer 120 is used for covering a surface of the cell string 110. The cover plate 130 is used for covering a surface of the encapsulation layer 120 away from the cell string 110. Since the solar cell 100 has the above-described technical effects, the photovoltaic module including the solar cell 100 should also have the above-described technical effects, which will not be repeated herein.

As shown in FIG. 5, the solar cells 100 are electrically connected in a form of a whole wafer or a plurality of separate wafers to form the plurality of cell strings 110, and the plurality of cell strings 110 are electrically connected in series and/or in parallel. For example, the plurality of cell strings 110 may be electrically connected to each other by a conductive belt. The encapsulation layer 120 covers a front side and a back side of the solar cells. For example, the encapsulation layer 120 may be an organic encapsulation film, such as an ethylene-vinyl acetate copolymer (EVA) adhesive film, a polyethylene octene co-elastomer (POE) adhesive film, a polyethylene glycol terephthalate (PET) film, or a polyvinyl butyral (PVB) adhesive film, etc. The cover plate 130 may be a cover plate 130 with a light transmittance function, such as a glass cover plate, a plastic cover plate, etc. For example, a surface of the cover plate 130 facing the encapsulation layer 120 may be a concave-convex surface, so as to increase the utilization rate of the incident light.

The same or similar parts between the various embodiments in this specification can be referred to each other. In particular, for the device embodiments and the terminal embodiments, since they are basically similar to the method embodiments, the description thereof is relatively simple, and the relevant parts can be referred to the description in the method embodiments.

The above description merely describes implementations of some embodiments of the present disclosure, but a scope of the embodiments of the present disclosure is not limited thereto, and any change or substitution made within the technical scope disclosed in the embodiments of the present disclosure shall fall within the scope of the embodiments of the present disclosure. Therefore, the scope of the embodiments of the present disclosure shall be based on the scope of the claims.

What is claimed is:

1. A solar cell comprising:

- a segmented solar cell, wherein the segmented solar cell comprises a substrate and an emitter formed at one side of the substrate along a thickness direction of the solar cell, and the segmented solar cell comprises at least one cutting surface parallel to the thickness direction;
- a composite layer, wherein the composite layer is formed at one side of the segmented solar cell close to the at least one cutting surface, and the composite layer is doped with aluminum element and oxygen element;
- a first passivation layer provided at the at least one cutting surface; and
- a field passivation layer provided at one side of the first passivation layer facing away from the composite layer, wherein the field passivation layer and the emitter have doping elements of different electric-conductive types.

2. The solar cell according to claim 1, wherein a doping concentration of the field passivation layer is greater than a doping concentration of the substrate.

3. The solar cell according to claim 1, wherein the field passivation layer is one or more of a doped polycrystalline silicon layer, a doped amorphous silicon layer or a doped microcrystalline silicon layer.

4. The solar cell according to claim 1, wherein along a first direction of the solar cell, a thickness d1 of the field passivation layer satisfies: 10 nm≤d1≤100 nm.

5. The solar cell according to claim 1, wherein the first passivation layer is at least one of an aluminum oxide layer, a silicon oxide layer, a silicon nitride layer, or a silicon nitride oxide layer.

6. The solar cell according to claim 1, wherein along a first direction of the solar cell, a thickness d2 of the first passivation layer satisfies: 1 nm≤d2≤4 nm.

7. The solar cell according to claim 1, wherein the composite layer comprises a first region and a second region, the first region is a region of the composite layer which is formed at one side of the substrate and the emitter close to the at least one cutting surface, and the first region is doped with aluminum element and oxygen element.

8. The solar cell according to claim 1, wherein along a first direction of the solar cell, a thickness d3 of the composite layer satisfies: 20 nm≤d3≤500 nm.

9. The solar cell according to claim 1, wherein a concentration of the aluminum element in the composite layer decreases along a direction away from the at least one cutting surface.

10. The solar cell according to claim 1, wherein a concentration of the oxygen element in the composite layer decreases along a direction away from the at least one cutting surface.

11. The solar cell according to claim 1, further comprising a second passivation layer, a tunnel oxide layer, a doped conductive layer, a third passivation layer, a first electrode, and a second electrode along the thickness direction of the solar cell,

- wherein the second passivation layer is provided at one side of the emitter away from the substrate, the tunnel oxide layer is provided at one side of the substrate away from the emitter, the doped conductive layer is provided at one side of the tunnel oxide layer away from the substrate, and the third passivation layer is provided at one side of the doped conductive layer away from the tunnel oxide layer, and
- wherein the first electrode passes through the second passivation layer to be electrically connected to the emitter, and the second electrode passes through the third passivation layer to be electrically connected to the doped conductive layer.

12. The solar cell according to claim 11, wherein the second passivation layer is of a single-layer structure or a stacked-layer structure, and a refractive index and thickness of each layer of the second passivation layer is respectively designed.

13. The solar cell according to claim 12, wherein the second passivation layer is at least one of a silicon nitride layer, a silicon nitride oxide layer, or a silicon oxide layer.

14. The solar cell according to claim 11, wherein the tunnel oxide layer is an ultrathin silicon oxide layer, and a thickness of the tunnel oxide layer is within a range from 1 nm to 2 nm.

15. The solar cell according to claim 11, wherein a doping element in the doped conductive layer is the same as a doping element in the substrate, and a concentration difference not equal to zero is formed between the doping element in the doped conductive layer and the doping element in the substrate.

16. The solar cell according to claim 11, wherein the third passivation layer is of a single-layer structure or a stacked-layer structure, and a refractive index and thickness of each layer of the second passivation layer is respectively designed.

17. The solar cell according to claim 16, wherein the third passivation layer is at least one of a silicon nitride layer, a silicon nitride oxide layer, a silicon oxide layer, or an aluminum oxide layer.

18. The solar cell according to claim 11, wherein at least a part of the first passivation layer and the field passivation layer is formed on the second passivation layer and/or the third passivation layer.

19. A tandem solar cell comprising:

a bottom solar cell, wherein the bottom solar cell is a solar cell comprising:

a segmented solar cell, wherein the segmented solar cell comprises a substrate and an emitter formed at one side of the substrate along a thickness direction of the solar cell, and the segmented solar cell comprises at least one cutting surface parallel to the thickness direction;

a composite layer, wherein the composite layer is formed at one side of the segmented solar cell close to the at least one cutting surface, and the composite layer is doped with aluminum element and oxygen element;

a first passivation layer provided at the at least one cutting surface; and a field passivation layer provided at one side of the first passivation layer facing away from the composite layer, wherein the field passivation layer and the emitter have doping elements of different electric-conductive types;

a top solar cell, which is one of a perovskite solar cell, a donor-acceptor solar cell, a cadmium telluride solar cell, a copper indium gallium selenide solar cell, or a gallium arsenide solar cell; and an intermediate connection layer connected between the bottom solar cell and the top solar cell.

20. A photovoltaic module comprising:

a cell string formed by connecting a plurality of solar cells, wherein a solar cell of the plurality of solar cells comprises:

a segmented solar cell, wherein the segmented solar cell comprises a substrate and an emitter formed at one side of the substrate along a thickness direction of the solar cell, and the segmented solar cell comprises at least one cutting surface parallel to the thickness direction;

a composite layer, wherein the composite layer is formed at one side of the segmented solar cell close to the at least one cutting surface, and the composite layer is doped with aluminum element and oxygen element;

a first passivation layer provided at the at least one cutting surface; and a field passivation layer provided at one side of the first passivation layer facing away from the composite layer, wherein the field passivation layer and the emitter have doping elements of different electric-conductive types;

an encapsulation layer configured to cover a surface of the cell string; and a cover plate configured to cover a surface of the encapsulation layer away from the cell string.

* * * * *